(12) United States Patent
Ueda et al.

(10) Patent No.: US 6,318,948 B1
(45) Date of Patent: Nov. 20, 2001

(54) SUBSTRATE TRANSFER APPARATUS AND SUBSTRATE PROCESSING APPARATUS

(75) Inventors: Issei Ueda, Kumamoto; Tadayuki Yamaguchi, Atsugi, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/311,883

(22) Filed: May 14, 1999

(30) Foreign Application Priority Data

May 15, 1998 (JP) .................................................. 10-134102
Jun. 5, 1998 (JP) .................................................. 10-158003

(51) Int. Cl.$^7$ .................................................. B05C 5/00
(52) U.S. Cl. ................ 414/416.08; 414/416.03; 414/217; 414/937; 414/939; 414/754; 118/719; 294/1.1; 432/239
(58) Field of Search .................... 414/935, 937, 414/939, 217, 941, 416.08, 754, 416.03; 432/239; 118/719; 294/1.1, 64.1, 64.3, 64.2

(56) References Cited

U.S. PATENT DOCUMENTS

| | | | |
|---|---|---|---|
| 5,061,144 | * 10/1991 | Akimoto et al. | 414/937 X |
| 5,565,034 | * 10/1996 | Nanbu et al. | 414/941 X |
| 5,647,626 | * 7/1997 | Chen et al. | 414/937 X |
| 5,669,644 | * 9/1997 | Kachotsu et al. | 414/941 X |
| 5,711,646 | * 1/1998 | Ueda et al. | 414/941 X |
| 5,746,460 | * 5/1998 | Marohl et al. | 414/941 X |
| 5,911,461 | * 6/1999 | Sauter et al. | 414/941 X |

FOREIGN PATENT DOCUMENTS

| | | | |
|---|---|---|---|
| 2-30194 | 7/1990 | (JP) . | |
| 4-14237 | 1/1992 | (JP) . | |
| 5-129417 | 5/1993 | (JP) . | |
| 2-271643 | * 11/1990 | (JP) | 414/937 |
| 5-13551 | * 1/1993 | (JP) | 414/937 |

* cited by examiner

Primary Examiner—Frank E. Werner
(74) Attorney, Agent, or Firm—Rader, Fishman & Grauer, PLLC

(57) ABSTRACT

This invention related to a substrate transfer apparatus having an arm holder moving into and out of a cassette while a substrate is mounted thereon, a forward and backward driving mechanism for moving the arm holder forward and backward, and a contact support member for supporting the substrate in contact with a lower surface peripheral portion of the substrate placed on the arm holder, said contact support member comprising a first defining portion for defining a front end of the substrate placed on the arm holder, and a second defining portion facing the first defining portion, for defining a rear end of the substrate placed on the arm holder.

18 Claims, 13 Drawing Sheets

SUBSTRATE TRANSFER APPARATUS AND SUBSTRATE PROCESSING APPARATUS

BACKGROUND OF THE INVENTION

The present invention relates to a substrate transfer apparatus for transferring a substrate such as a semiconductor wafer and an LCD substrate, and relates to a substrate processing apparatus.

In manufacturing processes of semiconductor devices and LCDs, a substrate is transferred sequentially to each of process sections by use of the substrate transfer apparatus. In each process section, a plurality of substrates are processed simultaneously. For example, in the photolithographic process of a semiconductor device, a wafer is transferred to a coating unit, in which a photoresist coating film is formed on the surface of the wafer, transferred to a light exposure unit, in which the photoresist coating film is pattern-exposed, and transferred to a development unit to develop the pattern-exposed photoresist coating film.

As an example of the transfer apparatus, an apparatus for transferring a wafer while holding it by vacuum-adsorption, is disclosed in Japanese Patent Application KOKAI Publication No. 6-85042. In the conventionally-used apparatuses, a wafer is vacuum-adsorbed by a vacuum chuck at a center portion of the rear surface thereof, so that particles (derived from the vacuum chuck) may possibly attach to the center portion of the rear surface of the wafer. If the wafer having particles attached on the rear surface is loaded into the light exposure unit, the accuracy of alignment between the wafer and an optical lens decreases, with the result that a pattern latent image cannot be formed on the photoresist film with a high accuracy.

On the other hand, the substrate transfer apparatuses disclosed in US Patent Publications Nos. 5,664,254 and 5,700,127 have an arm holder for holding a wafer in contact with a peripheral portion of the rear surface of the wafer. The arm holder has a contact support portion having a self-alignment means which allows the wafer to directly align upon reception. The diameter of the contact support portion of this type is formed slightly larger than that of the wafer. This is made in order to take out the wafer smoothly and securely from a cassette even if the wafer is placed at a position slightly away from a desired setting position in the cassette.

Incidentally, according to the SEMI (Semiconductor Equipment and Material International) standard, a silicon wafers of 200 mm (8 inch) and 300 mm (12 inch) diameter may have allowances (differences in size) of ±0.2 mm and ±0.5 mm, respectively. On the other hand, according to the JEIDA (Japan Electronic Industry Development Association) standard, a silicon wafer of 200 mm (8 inch) diameter may have an allowance of ±0.5 mm (Glade I) or ±1.0 mm (Grade II) and a silicon wafer of 300 mm (12 inch) diameter may have an allowance of ±0.2 mm. Therefore, the arm holder must have a contact support portion sufficiently large to support the wafer formed within such an allowance. To attain this, in the conventional contact support portion, an additional space clearance is added to the allowance for the wafer size. Consequently, if a wafer formed in a minimum diameter within the allowance range specified by the standard, is supported, a clearance produced between the contact support portion and the wafer results in 2 mm or more.

Since the wafer is loosely held by the arm holder as mentioned, it moves around on the arm holder during the transfer process. It follows that the member of the contact support portion is rubbed with the wafer, possibly producing particles. Furthermore, when the wafer is transferred from the substrate transfer apparatus to another apparatus, alignment operation of the wafer must be repeated again in said another apparatus. More specifically, it is necessary to align the wafer in every process unit and a transfer apparatus of the light exposure apparatus. However, if an alignment means is newly installed to another transfer apparatus, the apparatus is enlarged and complicated, giving a large foot print of the apparatus.

BRIEF SUMMARY OF THE INVENTION

An Object of the present invention is to provide a substrate transfer apparatus capable of reducing an amount of particles generated during the substrate transfer and requiring no substrate alignment in an apparatus other than the substrate transfer apparatus, and provide a substrate processing apparatus having a small foot print.

According to the present invention, there is provided an apparatus for transferring a substrate comprising:

an arm holder moving into and out of a cassette while a substrate is mounted thereon;

a forward and backward driving mechanism for moving the arm holder forward and backward; and a contact support member for supporting the substrate in contact with a lower surface peripheral portion of the substrate placed on the arm holder.

The contact support member comprises a first defining portion for defining a front end of the substrate placed on the arm holder; and a second defining portion facing the first defining portion, for defining a rear end of the substrate placed on the arm holder.

It is preferable that the first defining portion consist of a single stepped portion, and the second defining portion consist of upper and lower steps continuously formed. When the arm holder is retreated by the forward and backward driving mechanism, the rear end of the substrate is slid down from the upper stepped portion of the second defining portion to the lower stepped portion.

The lower stepped portion of the second defining portion is located nearer the stepped portion of the first defining portion than the upper stepped portion of the second defining portion. Furthermore, the upper stepped portion of the second defining portion is present in substantially the same plane as the stepped portion of the first defining portion.

It is preferable that the substrate transfer apparatus further comprise a transfer base table for movably supporting the arm holder and a contact member attached to the transfer base table.

When the arm holder is retreated by the forward and backward driving mechanism, the rear end of the substrate placed on the arm holder comes into contact with the contact member, and thereby the rear end of the substrate is slid down from the upper stepped portion of the second defining portion to the lower stepped portion.

The distance from the lower stepped portion of the second defining portion and the stepped portion of the first defining portion corresponds to the length of the diameter of the substrate plus allowance.

It is preferable that the substrate transfer apparatus further comprise a push mechanism for moving the second defining portion toward the first defining portion. In this case, it is further preferable that a press member be attached to the second defining portion, for pressing an upper portion of the rear end of the substrate.

According to the present invention, there is provided an apparatus for processing substrate comprising:

a process section for processing resist of a substrate;

a cassette section for receiving the substrate together with a cassette and transferring the substrate to/from the process section;

an interface section for transferring the substrate to/from another apparatus and transferring the substrate to/from the process section; and a substrate transfer apparatus arranged in at least one of the cassette section and the interface section, for transferring the substrate.

The substrate transfer apparatus comprises an arm holder moving into and out of a cassette while a substrate is mounted thereon;

a forward and backward driving mechanism for moving the arm holder forward and backward; and a contact support member for supporting the substrate in contact with a lower surface peripheral portion of the substrate placed on the arm holder.

The contact support member comprises:

a first defining portion for defining a front end of the substrate placed on the arm holder; and a second defining portion facing the first defining portion, for defining a rear end of the substrate placed on the arm holder.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, various preferable embodiments of the present invention will be explained with reference to the accompanying drawings.

Figure 1:
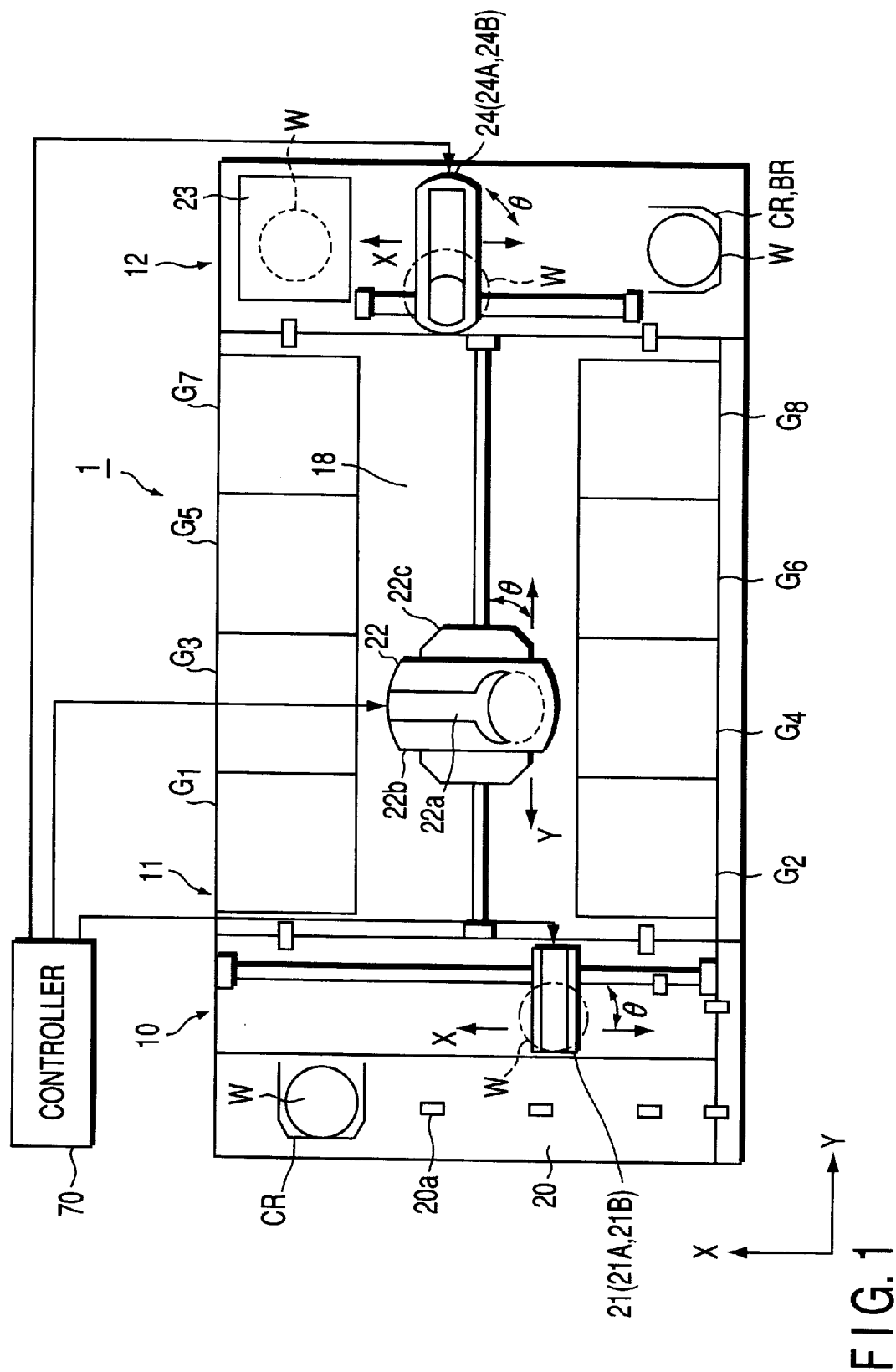
FIG. 1 is a schematic plan view showing a resist coating/developing system.
Figure 2:
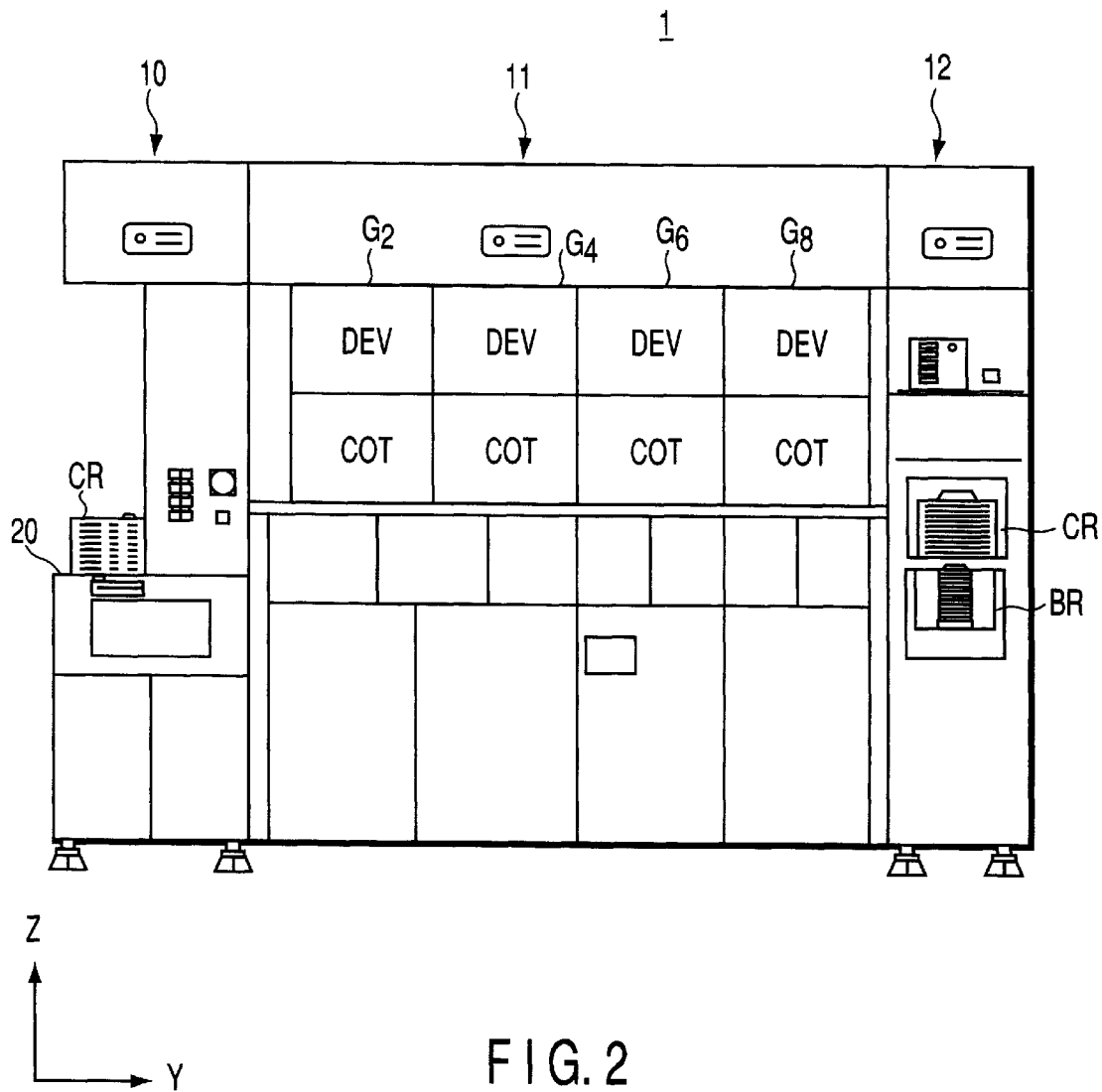
FIG. 2 is a schematic front view showing the resist coating/developing system.
Figure 3:
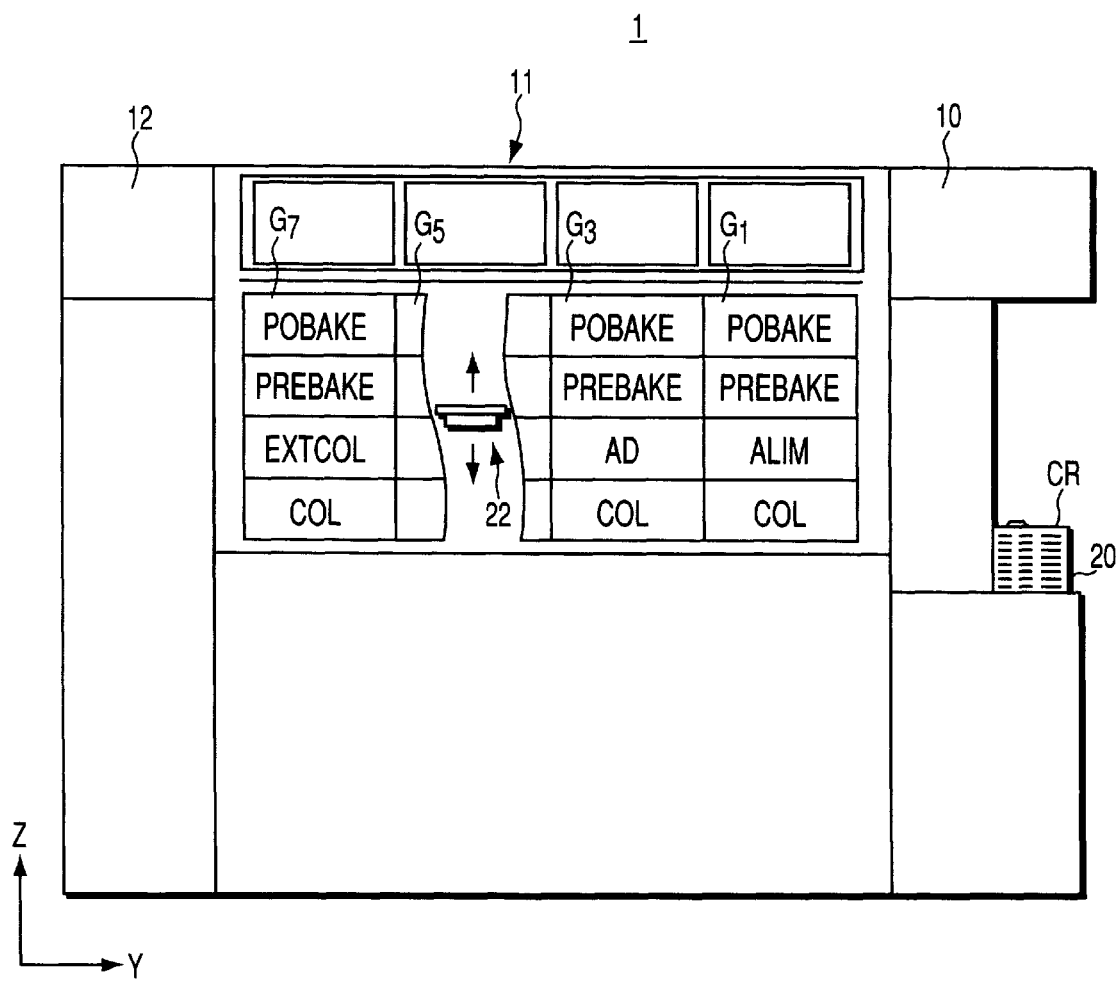
FIG. 3 is a schematic rear view showing the resist coating/developing system.

As shown in FIGS. 1 to 3, a coating/developing system 1 comprises a cassette section 10, a process section 11, an interface section 12, and a controller 70. The substrate transfer apparatus of the present invention, namely, first and second transfer arm mechanisms 21, 24, are provided in the cassette section 10 and the interface section 12, respectively. In the process section 11, a main transfer arm mechanism 22 is provided. Furthermore, a light exposure unit (not shown) is arranged next to the interface section 12. The light exposure apparatus has a transfer apparatus for transferring a wafer W.

The controller 70 controls operation of each of the mechanisms 21, 22, 24 so as to transfer the wafer W between the main transfer arm mechanism 22 and the first and second sub transfer arm mechanisms 21, 24. Furthermore, the controller 70 controls operations of the second sub transfer arm mechanism 24 and the transfer apparatus in the light-exposure unit so as to transfer the wafer W between them.

The cassette portion 10 comprises a cassette mounting table 20 and a first sub transfer arm mechanism 21. The cassette mounting table 20 extends in an X-axis direction and has four alignment members 20a. When the cassette CR is mounted on the mounting table 20, the cassette CR is aligned by the corresponding member 20a. Two of the four cassettes CR placed on the mounting table 20 accommodate unprocessed wafers W, whereas the rest two cassettes CR house processed wafers W.

Figure 4:
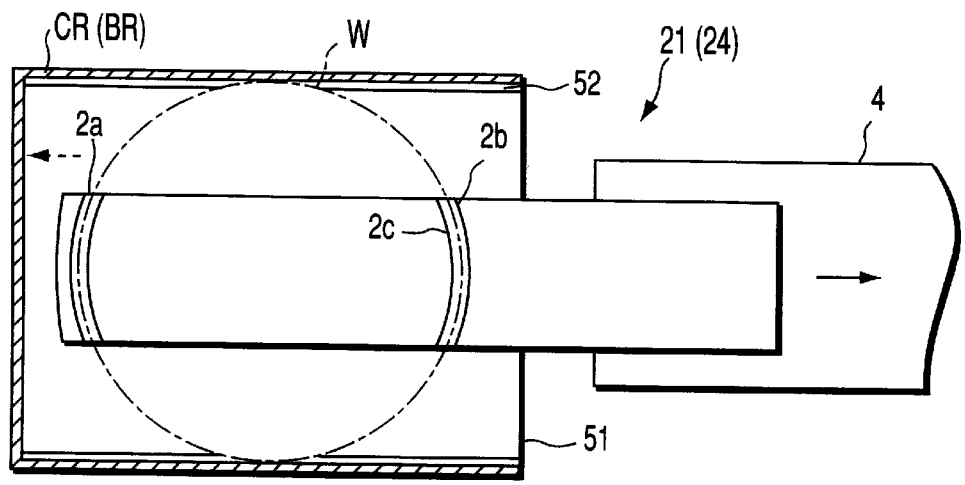
FIG. 4 is a plan view showing a substrate transfer apparatus according to an embodiment of the present invention.
Figure 5:
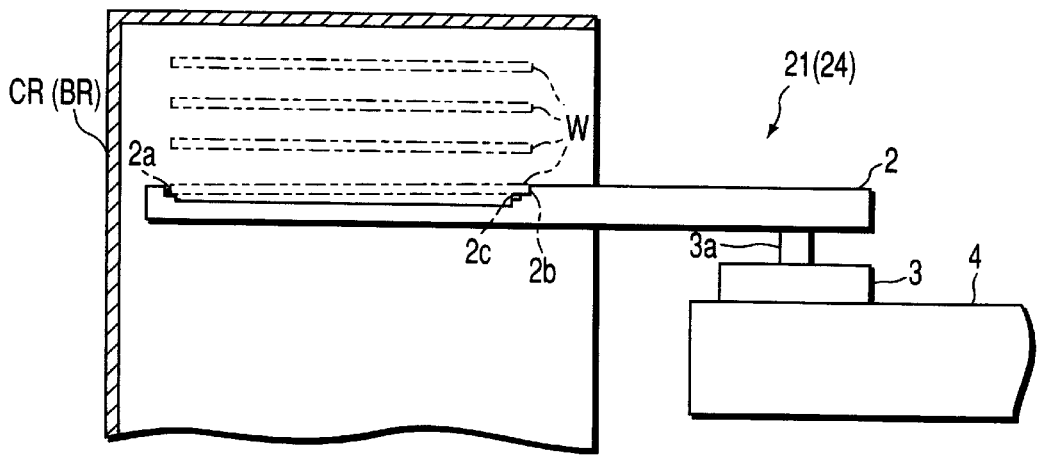
FIG. 5 is a perspective sectional view of a substrate transfer apparatus and a cassette according to an embodiment of the present invention as viewed from the side.
Figure 6:
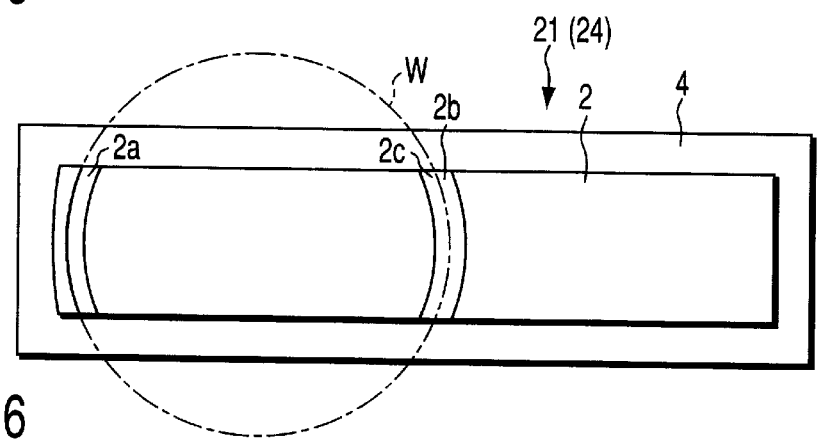
FIG. 6 is a plan view showing a substrate transfer apparatus according to an embodiment of the present invention.

As shown in FIG. 4, the wafer cassette CR has an opening 51 through which the wafer W is loaded/unloaded. A plurality of grooves 52 are formed in the inner wall of the cassette CR at regular intervals. Wafers are inserted into the corresponding grooves 52 at the periphery. The wafers W are therefore held in the cassette CR at regular intervals. A plurality of grooves are also formed in the inner wall of the buffer cassette BR to hold the wafers W at regular pitches (intervals).

The first sub transfer arm mechanism 21 has an arm holder 2, a transfer base table 4, a forward and backward driving mechanism 3 for moving the arm holder 2 back and forth, an X-axis driving mechanism (not shown) for moving the transfer base table 4 in the X-axis direction, a Z-axis driving mechanism (not shown) for moving the transfer base table 4 up and down, and a θ rotation driving mechanism (not shown) for rotating the transfer base table 4 about the Z-axis. The arm holder 2 is supported by the transfer base table 4 by way of a support shaft 3a of the forward and backward driving mechanism 3. As the forward and backward driving mechanism 3, a cylinder mechanism and a belt mechanism are used. The forward and backward driving mechanism, X-axis driving mechanism, Z-axis driving mechanism and θ rotation driving mechanism are disclosed in, for example, US Patent Publication No. 5,664,254.

The process section 11 has eight process unit groups G1, G2, G3, G4, G5, G6, G7, G8 and a main transfer arm mechanism 22. A passage 18 is provided in the center of the process section 11. The main transfer arm mechanism 22 moves through the passage 18. The main transfer arm mechanism 22 has an arm holder 22a and transfer base tables 22b, 22c. The arm holder 22a is moved back and forth by the forward and backward driving mechanism (not shown) along the transfer base table 22b. An upper transfer base table 22b is supported by the θ rotation driving mechanism (not shown) movably about the Z-axis to a lower transfer base table 22c. Furthermore, the transfer base table 22c is supported movably in the Y-axis direction by the Y-axis driving mechanism (not shown) and movably up and down by the Z-axis driving mechanism (not shown).

Along one side of the passage 18, first, third, fifth, and seventh process units groups G1, G3, G5, G7 are arranged side by side. Along the other side of the passage 18, second, fourth, sixth, and eighth process units G2, G4, G6, G8 are arranged side by side. The second, fourth, sixth and eighth process unit groups G2, G4, G4, G8 are arranged in the front of the system 1, whereas the first, third, fifth and seventh process unit groups G1, G3, G5, G7 are arranged at the back of the system 1.

As shown in FIG. 2, each of the second, fourth, sixth and eighth process unit groups G2, G4, G6, G8 has a resist coating unit (COT) and a development unit (DEV), stacked vertically in upper and lower layers.

As shown in FIG. 3, the first process unit group G1, has a cooling unit (COL), an alignment unit (ALIM), a prebaking unit (PREBAKE), and a post baking unit (POBAKE) stacked in the order mentioned, from the bottom.

The third process unit group G3 has a cooling unit (COL), an adhesion unit (AD), a prebaking unit (PREBAKE), and a post baking unit (POBAKE) in the order mentioned, from the bottom.

Each of the fifth and seventh process unit groups G5, G7 has a cooling unit (COL), an extension cooling unit (EXTCOL), a prebaking unit (PREBAKE) and a postbaking unit (POBAKE) in the order mentioned, from the bottom.

As described, since the cooling unit (COL) and extension cooling unit (EXTCOL) are arranged in lower stages, whereas the prebaking unit (PREBAKE), postbaking unit (POBAKE), and adhesion unit (AD) are arranged at the upper stages. In this manner, it is possible to prevent thermal interference between a high-temperature processing unit and a low-temperature processing unit.

In the interface section 12, a movable pick-up cassette CR, an unmovable buffer cassette BR, a peripheral light exposure unit 23, and a second sub transfer arm mechanism (substrate transfer apparatus) 24 are arranged. The second sub transfer arm mechanism 24 has an arm holder 2, a transfer base table 4, a forward and backward driving mechanism 3 for moving the arm holder 2 back and forth, an X-axis driving mechanism (not shown) for moving the transfer base table 4 in the X-axis direction, a Z-axis driving mechanism (not shown) for moving the transfer base table 4 up and down, and a θ rotation driving mechanism (not shown). The arm holder 2 is supported by the transfer base table 4 via a support shaft 3a of the forward and backward driving mechanism 3. The second sub transfer arm mechanism 24 is responsible for transferring the wafer W not only to/from the main transfer arm mechanism 22 but also to/from the transfer apparatus (not shown) in the light exposure apparatus. The second sub transfer arm mechanism 24 is responsible for loading/unloading the wafer W into/from both cassettes CR, BR and the peripheral light exposure apparatus 23.

The development unit (DEV) has a spin chuck equipped with a vacuum adsorption mechanism, a cup having a discharge port and an exhaust port, and a developing solution supply nozzle. On the other hand, the resist coating unit (COT) has a spin chuck equipped with a vacuum adsorption mechanism, a cup having a discharge port and an exhaust port, and a resist solution supply nozzle.

Now, referring to FIGS. 4 to 10, a substrate transfer apparatus according to a first embodiment of the present invention will be explained. Since the first and second sub transfer arm mechanisms 21 and 24 are substantially the same, the explanation for the second sub transfer arm mechanism 24 will be omitted.

Figure 7:
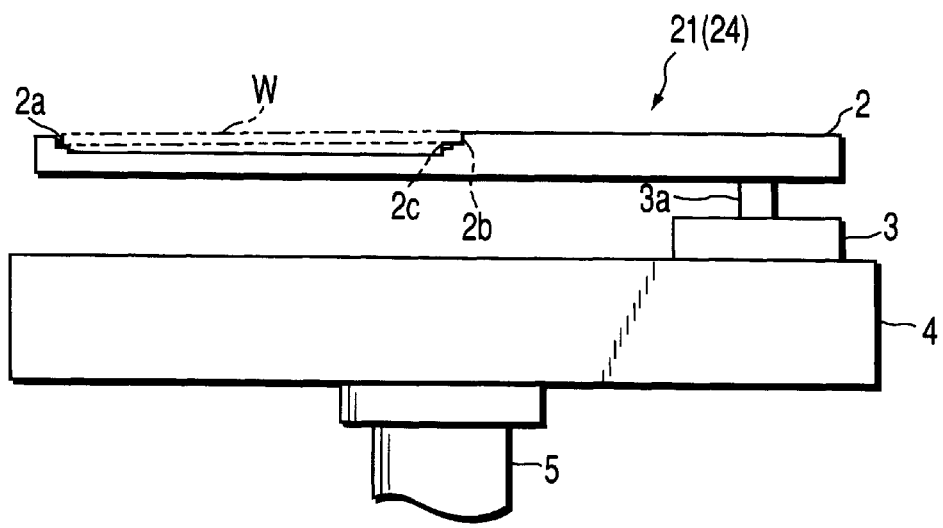
FIG. 7 is a side view showing a substrate transfer apparatus according to an embodiment of the present invention.

As shown in FIG. 4, the substrate transfer apparatus, namely, the sub transfer arm mechanism 21, has an arm holder 2 for holding the wafer W. The arm holder 2 is formed of a ceramic thin plate or a resin thin plate. The width of the arm holder 2 is sufficiently smaller than that of the opening 51 of the cassette CR or BR. The length of the arm holder 2 is sufficiently longer than the depth of the cassette CR or BR. Furthermore, the thickness of the front end portion of the arm holder 2 is smaller than that of the rear end portion of the arm holder 2. As shown in FIG. 7, the arm holder 2 is supported by the transfer base table 4 via the forward and backward driving mechanism 3. The transfer base table 4 is supported by a rod 5 of the Z-axis driving mechanism (not shown).

Figure 8A:
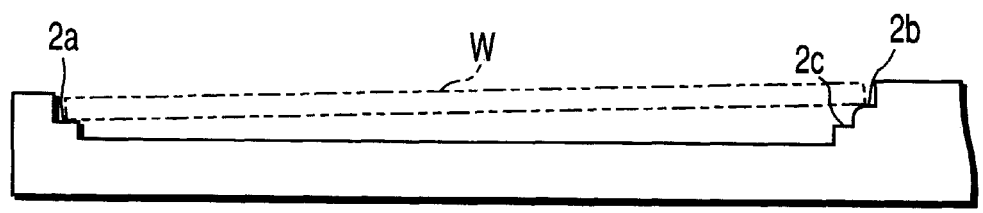
FIGS. 8A and 8B are magnified views of an arm holder as viewed from the side.
Figure 8B:
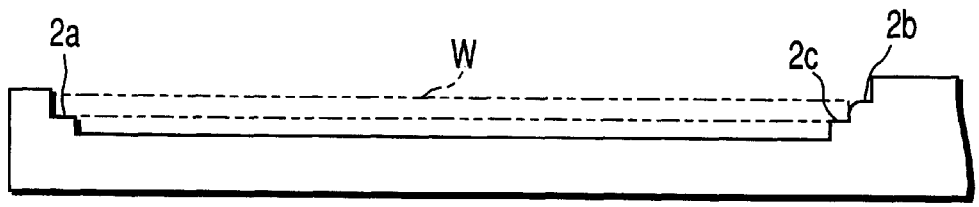

As shown in FIGS. 7, 8A and 8B, a single stepped portion 2a and a double stepped portion consisting of upper and lower stepped portions 2b, 2c, are formed on the upper surface of the arm holder 2. The step portion 2a serving as a first defining portion is positioned near the front end of the arm holder 2. One of the sides (front end side) of the wafer W is mounted on the stepper portion 2a. The stepped portions 2b, 2c serving as a second defining portion, is positioned near the rear end of the arm holder 2. The other side of the wafer W is mounted on either the upper stepped portion 2b or the lower stepped portion 2c. The edge portion of the upper stepped portion 2b is formed round. The upper stepped portion 2b is formed continuously to the lower stepped portion 2c via the round edge portion. The lower stepped portion 2c is formed at the same level (height) as the stepped portion 2a near the front end. It is preferred that the height of each of the stepped portions 2a, 2b, 2c be substantially the same as the thickness of the wafer W.

In the meantime, the wafer W is not positioned accurately by the holding groove 52 of the cassette CR (BR). More specifically, since the holding groove 52 is formed larger than the diameter of the wafer W, by at least the additional allowance, the position of the wafers W differ within the cassette CR (BR). When the wafer W is initially held by the arm holder 2, the wafer W may be held in the state shown in FIG. 8A in some cases or in FIG. 8B in other cases. Assuming that the wafer W is transferred from the cassette CR (BR) to the arm holder 2 and mounted on the upper stepped portion 2b near the rear-end peripheral portion (coarse alignment) as shown in FIG. 8A, and then, the arm holder 2 is retreated, the rear end peripheral portion is slid down from the upper stepped portion 2b to the lower stepped portion 2c, as shown in FIG. 8B (accurate alignment).

Now, a procedure for processing the wafer W in the aforementioned coating/developing system 1 will be explained briefly.

First of all, the first sub transfer arm mechanism 21 gains access to the cassette CR placed on the mounting table 20 and takes out a single unprocessed wafer W from the cassette CR. At that time, the wafer W is accurately aligned on the arm holder 2. Then, the first sub transfer arm mechanism 21 transfers the wafer W to the main transfer arm mechanism 22. The main transfer arm mechanism 22 moves to the alignment unit (ALIM) of the first process unit group G1 and transfers the wafer W into the alignment unit (ALIM). In the alignment unit (ALIM), the wafer W is aligned by an orientation flat and centered.

Subsequently, the main transfer arm mechanism 22 sequentially transfers the wafer W to the adhesion unit (AD), the prebaking unit (PREBAKE), the cooling unit (COL), the resist coating unit (COT), the prebake unit (PREBAKE), and the extension/cooling unit (EXTCOL).

Furthermore, the main transfer arm mechanism 22 transfers the wafer W to the second sub transfer arm mechanism 24. The second sub transfer arm mechanism 24 transfers the wafer W to the peripheral light exposure unit 23 within the interface section 12. When the light-exposure process is completed, the second sub transfer arm mechanism 24 transfers the wafer W to a wafer receiving table (not shown) near the light exposure unit. At this time, in some cases, the wafer W is temporarily stored in the buffer cassette BR before loaded into the light exposure unit. After the wafer W is unloaded from the light exposure unit, the wafer W is also sometimes temporarily stored in the buffer cassette BR within the interface section 12.

The main transfer arm mechanism 22 sequentially transfers the post-exposure wafer W to the post baking unit (POBAKE), the cooling unit (COL), the development unit (DEV), the post baking unit (POBAKE), and the cooling unit (COL).

Furthermore, the main transfer arm mechanism 22 transfers the wafer W to the first sub transfer arm mechanism 21. The first sub transfer arm mechanism 21 loads the wafer W into the cassette CR on the mounting table 20. When the cassette CR is filled with the processed wafers W, the wafers are unloaded from the system 1 while they are stored in the cassette CR.

According to the aforementioned embodiment, the wafer W can be transferred virtually without shaking. It is therefore possible to significantly reduce an amount of particles produced during the transfer of the wafer W.

Since the wafer W is aligned accurately on the arm holder of the substrate transfer apparatus, it is not necessary to align the wafer W in every process unit and the light exposure unit. In other words, an alignment mechanism exclusive to the system 1 is not required. As a result, the system 1 can be reduced in size and the structure thereof can be simplified. Equipment cost is therefore reduced.

Figure 9:
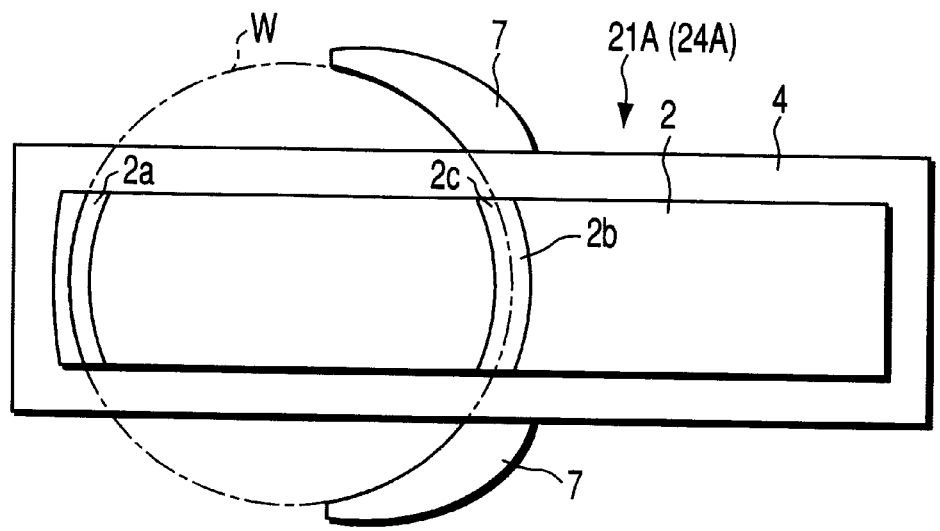
FIG. 9 is a plan view showing an arm holder according to another embodiment.
Figure 10:
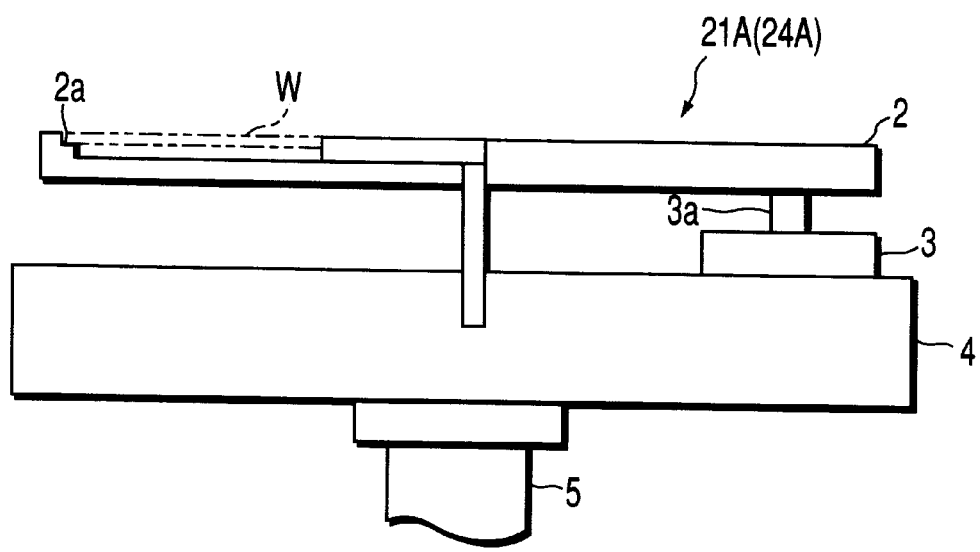
FIG. 10 is a side view showing a substrate transfer apparatus according to another embodiment.

Now, referring to FIGS. 9 and 10, another embodiment will be explained.

The sub transfer arm mechanism 21A (24A) of this embodiment has a pair of contact members 7 fixed on the transfer base table 4. The inner surface of each of the contact members 7 is formed so as to correspond to an outer peripheral curvature of the wafer W. When the arm holder 2 is moved forward to hold the wafer W within the cassette CR and then it is retreated, the wafer W comes into contact with an inner surfaces of the contact members 7. In this way, the wafer W is forcibly moved down from the upper stepped portion 2b to the lower stepped portion 2c.

Referring now to FIGS. 11 to 20, a second embodiment of the present invention will be explained.

Figure 11:
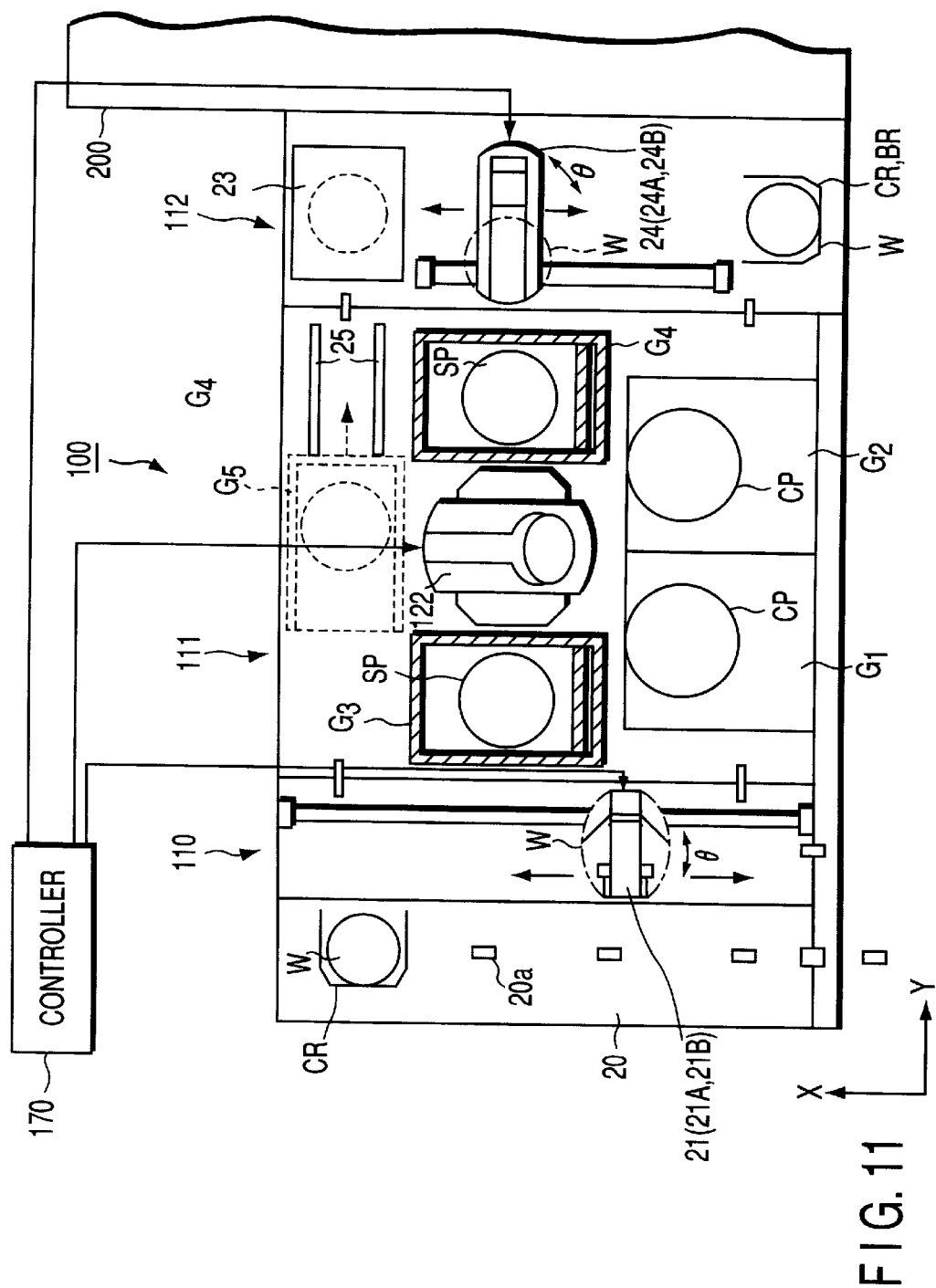
FIG. 11 is a schematic plan view showing a resist coating/developing system.
Figure 12:
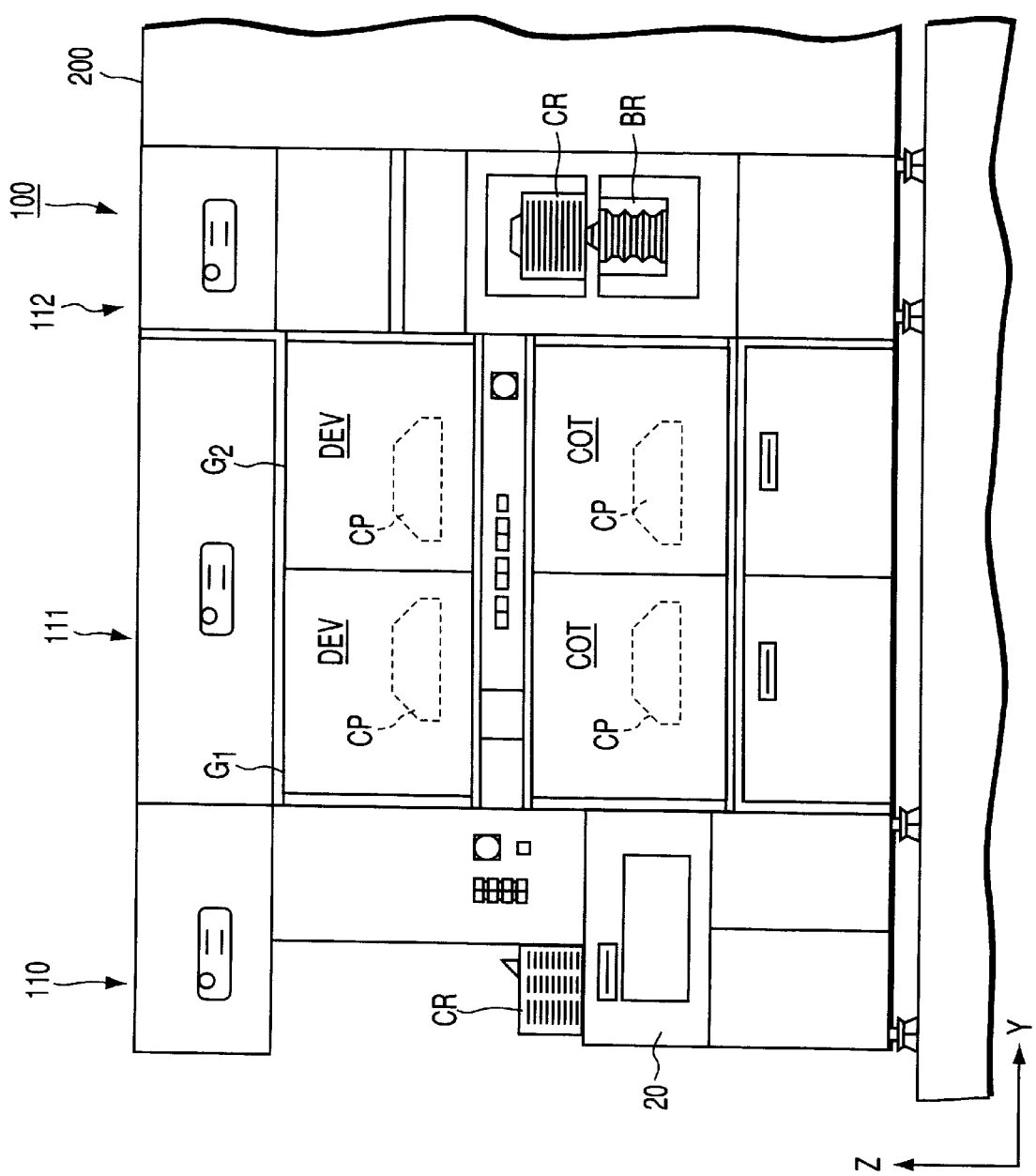
FIG. 12 is a schematic front view showing the resist coating/developing system.
Figure 13:
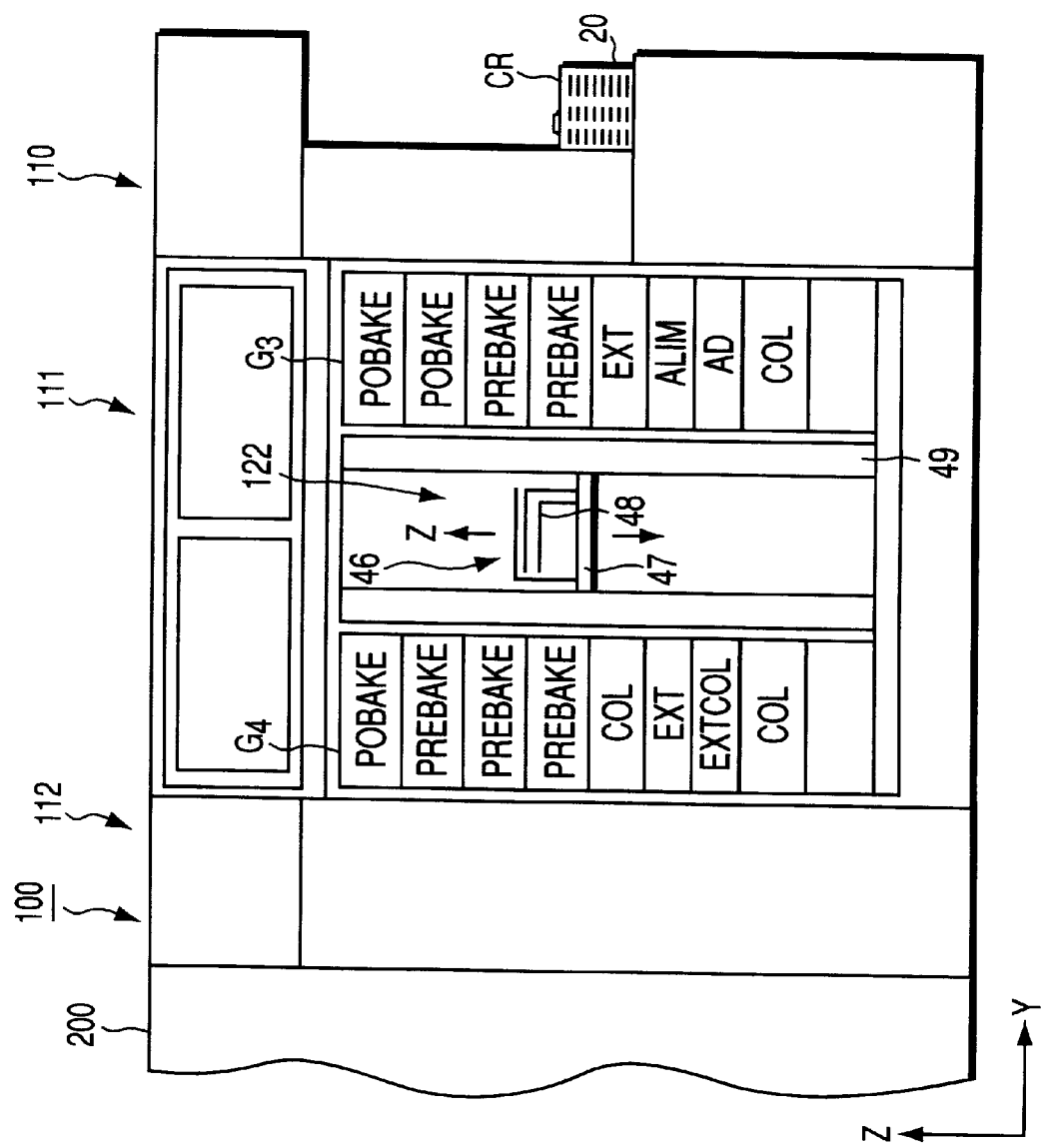
FIG. 13 is a rear view showing the resist coating/developing system.

As shown in FIGS. 11 to 13, a coating/developing system 100 has a cassette section 110, a process section 111, an interface section 112, and a controller 170. The substrate transfer apparatus of the present invention, namely, first and second sub transfer arm mechanisms 21B, 24B, are arranged in the cassette section 110 and the interface section 112, respectively. A main transfer arm mechanism 122 is arranged in the process section 111. Furthermore, a light-exposure unit (not shown) is arranged next to the interface section 112. The light-exposure unit has a transfer apparatus (not shown) for transferring the wafer W.

The controller 170 controls operation of each of arm mechanisms 122, 21B and 24B so as to transfer the wafer W between the main transfer arm mechanism 122 and the first and second sub transfer arm mechanisms 21B, 24B. Furthermore, the controller 170 controls the second sub transfer arm mechanism 24B and the transfer apparatus within the light exposure unit so as to transfer the wafer W between them.

The cassette section 110 has a cassette mounting table 20 and the first sub transfer arm mechanism 21B. The cassette mounting table 20 extends in an X-axis direction and has four alignment members 20a thereon. When the cassette CR is mounted on the mounting table 20, the cassette CR is aligned by the corresponding member 20a. Two of the four cassettes CR on the mounting table 20 house unprocessed wafers W, whereas the rest two cassettes accommodate processed wafers W.

The first sub transfer arm mechanism 21B has an arm holder 2, a transfer base table 4, a forward and backward driving mechanism 3 for moving the arm holder 2 back and forth, an X-axis driving mechanism (not shown) for moving the transfer base table 4 in the X-axis direction, a Z-axis driving mechanism (not shown) for moving the transfer base table 4 up and down, and a θ rotation driving mechanism (not shown) for rotating the transfer base table 4 about the Z-axis. The arm holder 2 is supported by the transfer base table 4 via a support shaft 3a of the forward and backward driving mechanism 3.

The process section 111 has five process unit groups G1, G2, G3, G4, G5 and a main transfer arm mechanism 122 responsible for vertical transfer. The five process unit groups G1, G2, G3, G4, G5 are arranged so as to surround the main transfer arm mechanism 122. The fifth process unit group G5 is movably arranged along a rail 25 in the Y-axis direction. The main transfer arm mechanism 122 has a plurality of arm holders 48, a transfer base table 47, an arm holder forward and backward driving mechanism, an arm holder upward and downward driving mechanism, and an arm holder rotation driving mechanism. Each of the arm holders 48 is moved forward and backward by the arm holder forward and backward driving mechanism. The arm holder 48 is moved up and down in the Z-axis direction together with the transfer base table 47 by the arm holder upward and downward driving mechanism. The arm holder 48 is rotated by an angle of θ about the Z-axis together with the transfer base table 47 by the arm holder rotation driving mechanism.

As shown in FIG. 12, first and second process unit groups G1, G2 are arranged in the front of the system 100. The first process unit group G1 has a resist coating unit (COT) and a development unit (DEV). The second process unit group G2 has a resist coating unit (COT) and a development unit (DEV). The resist coating unit (COT) and the development unit (DEV) are stacked in the order mentioned, from the bottom.

As shown in FIG. 13, the third and fourth process unit groups G3, G4 are arranged at the back of the system unit 100. The third process unit group G3 has a cooling unit (COL), an adhesion unit (AD), an alignment unit (ALIM), an extension unit (EXT), a prebaking unit (PREBAKE), and a postbaking unit (POBAKE). The fourth process unit group G4 has a cooling unit (COL), an extension/cooling unit (EXTCOL), an extension unit (EXT), a cooling unit (COL), a prebaking unit (PREBAKE), and a postbaking unit (POBAKE). The fourth process unit group G4 is arranged next to an interface section 112. Furthermore, a light-exposure unit 200 is arranged next to the interface section 112.

As shown in FIG. 11, a movable wafer cassette CR and an unmovable buffer cassette BR are arranged in two stages in the front of the interface section 112, whereas a peripheral light-exposure unit 23 is arranged at the back of the interface section 112.

The interface section 112 has the substrate transfer apparatus of the present invention, namely, a second sub transfer arm mechanism 24B. The second sub transfer arm mechanism 24B has an arm holder 2, a transfer base table 4, a forward and backward driving mechanism 3 for moving the arm holder 2 forward and backward, and an X-axis driving mechanism (not shown) for moving the transfer base table 4 in the X-axis direction, a Z-axis driving mechanism (not shown) for moving the transfer base table up and down, and a θ rotation driving mechanism (not shown) for rotating the transfer table 4 about the Z-axis. The arm holder 2 is supported by the transfer base table 4 via a support shaft 3a of the forward and backward driving mechanism 3. The second sub transfer arm mechanism 24B is responsible for loading/unloading the wafer W into/from both cassettes CR and BR and transferring the wafer W into a peripheral light-exposure unit 23.

Now, referring to FIGS. 14 to 18, another embodiment of the substrate transfer apparatus will be explained. The first and second sub transfer arm mechanisms 21B and 24B are substantially the same, so that explanation for the second sub transfer arm mechanism 24b will be omitted.

Figure 14:
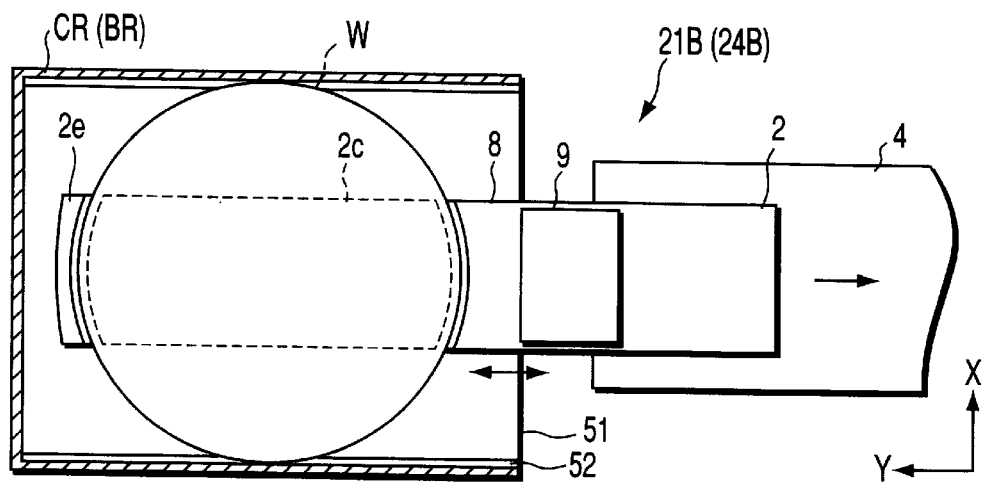
FIG. 14 is a plan view showing a substrate transfer apparatus according to another embodiment of the present invention.
Figure 15:
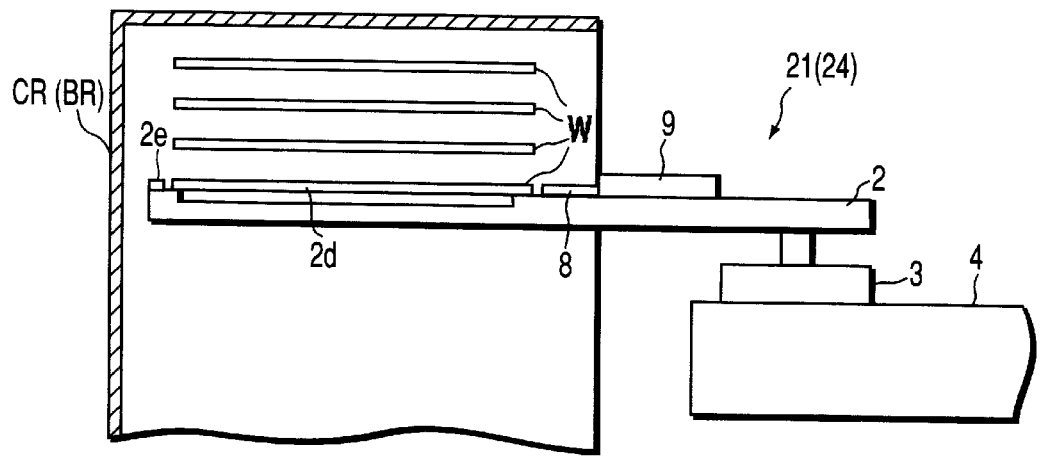
FIG. 15 is a perspective sectional view of a substrate transfer apparatus and a cassette according to another embodiment of the present invention as viewed from the side.
Figure 16:
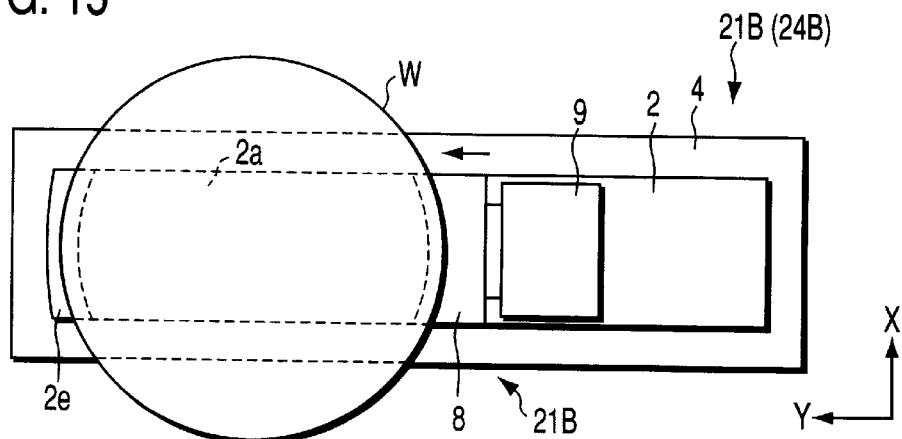
FIG. 16 is a plan view showing a substrate transfer apparatus according to an embodiment of the present invention.
Figure 17:
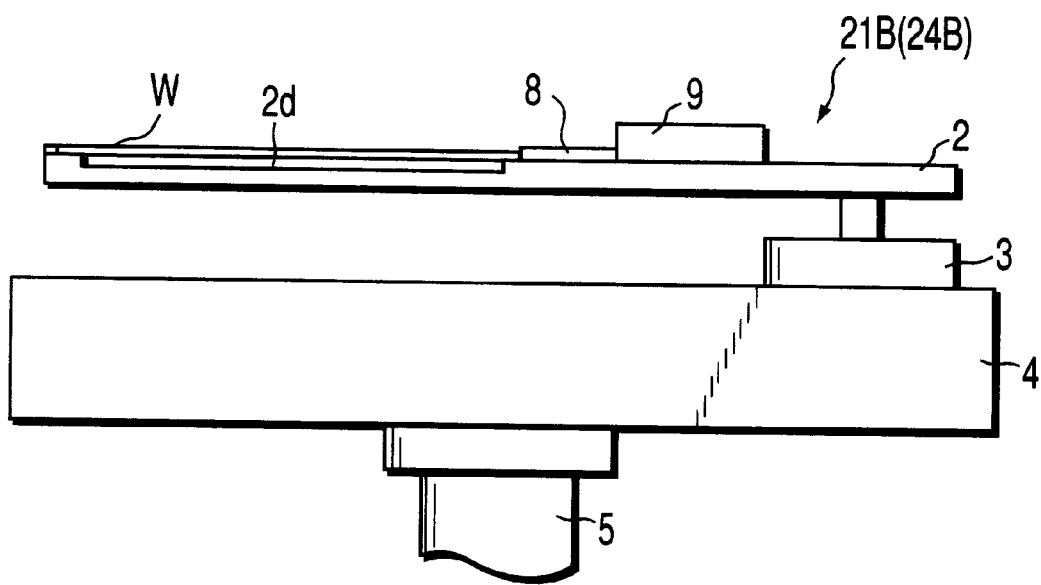
FIG. 17 is a side view showing a substrate transfer apparatus according to another embodiment of the present invention.

As shown in FIG. 14, a substrate transfer apparatus, namely, a sub transfer arm mechanism 21B, has an arm holder 2 for holding a wafer W. The arm holder 2 is made of a ceramic thin plate or a resin thin plate. The width of the arm holder 2 is sufficiently smaller that that of the opening 51 of a cassette CR (BR). The length of the arm holder 2 is sufficiently longer than the depth of the cassette CR (BR). As shown in FIG. 17, the arm holder 2 is supported by the transfer base table 4 via the θ rotation driving mechanism 3. The transfer base table 4 is supported by a rod 5 of the Z-axis driving mechanism (not shown). These driving mechanism employs a direct drive motor to transfer the wafer W accurately in position.

As shown in FIGS. 14 to 17, a depressed portion 2d is formed in the upper surface of the arm holder 2. A stopper 2e and a movable pusher 8 are arranged so as to sandwich the depressed portion 2d. The diameter of the depressed portion 2d is smaller than that of the wafer W. The stopper 2e serving as a first defining portion is fixed near a front end of the arm holder 2. The movable pusher 8 serving as a second defining portion is movably fitted near a rear end of the arm holder 2. The inner surfaces of the stopper 2e and the movable pusher 8 are individually formed in an arc form so as to correspond to the outer periphery of the wafer W.

The movable pusher 8 is slidable along the upper surface of the arm holder 2 and connected to and supported by a rod of an air cylinder 9. The driving source of the air cylinder 9 is controlled by a controller 170. Note that the stopper 2e and the movable pusher 8 are located at the same level (height). It is preferable that the thicknesses of the stopper 2e and the movable pusher 8 be set the same as that of the wafer W. It is further preferable that the stopper 2e and the movable pusher 8 be formed of a soft resin, for example, PFA, so as not to damage the wafer W. As the driving means 9 for slidably moving the movable pusher 8, a ball screw mechanism may be employed.

Figure 18:
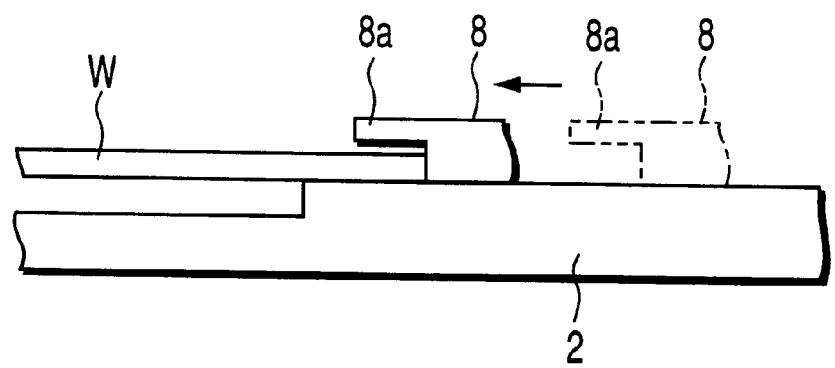
FIG. 18 is a partially enlarged view showing a movable pusher according to another embodiment.

As shown in FIG. 18, a press portion 8a may be provided on an upper portion of the tip of the movable pusher 8. The press portion 8a is responsible for suppressing the wafer W from jumping up and down on the arm holder 2 and further for transferring the wafer W stably.

Figure 19:
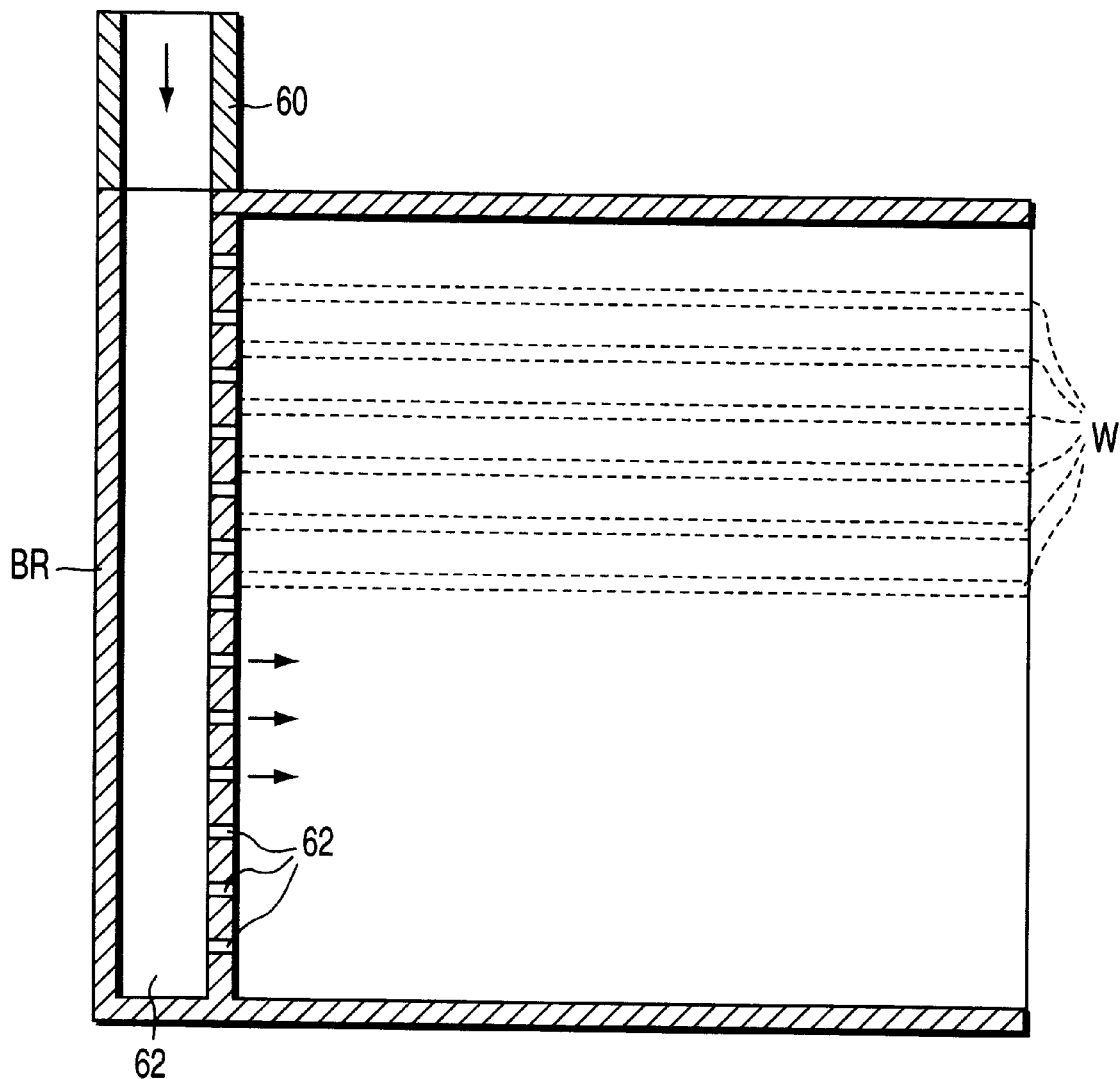
FIG. 19 is a perspective sectional view showing a buffer cassette of an interface section.

After temperature of the wafer W is controlled at a predetermined temperature, the wafer W is exposed in a light-exposure unit 200. If the wafer receiving table is eliminated from the light-exposure unit 200, the time period during which the wafer W is placed in the light-exposure unit 200, is reduced. It is therefore preferable that a means for controlling temperature of the wafer W be installed to the interface section 112. For example, a temperature control mechanism for wafer W is added to the buffer cassette BR of the interface section 112, as shown in FIG. 19. Such a temperature control mechanism has a duct 60 communicating with an air supply source (not shown), a flow passage 61 communicating with the duct 60, and a plurality of holes 62 which allow the flow passage 61 to communicate with an inner portion of the buffer cassette BR. The air supply source (not shown) has a temperature/humidity control section for controlling temperature and humidity of clean air.

Figure 20:
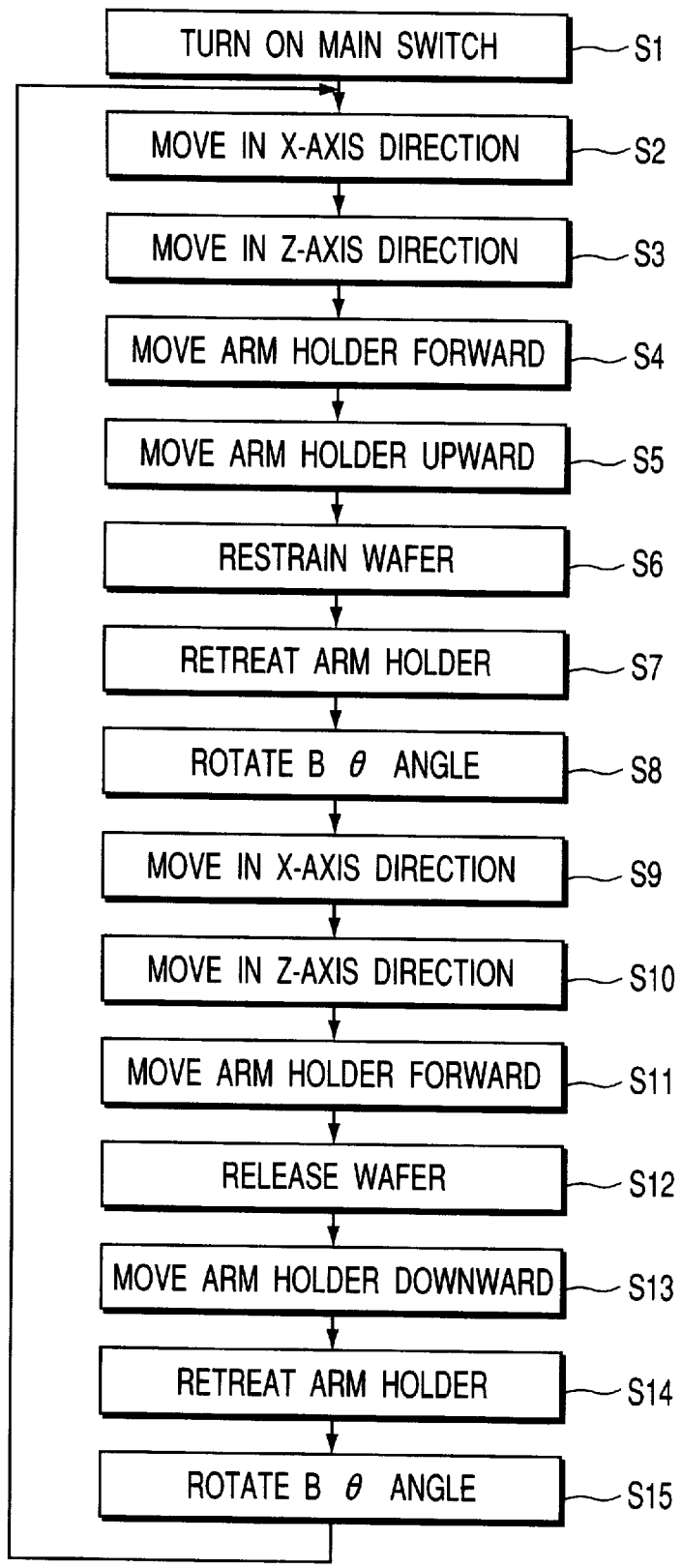
FIG. 20 is a flowchart when the wafer is transferred by the substrate transfer apparatus according to the present invention.

Referring now to FIG. 20, transfer and processing procedure of the wafer W in the process system 100 will be explained.

When the main switch is turned on, a fine filter unit (FFU) is first actuated to form a descending flow of clean air within the process system 100. At almost the same time, power is supplied to stand-by power sources of the main transfer arm mechanism 122 and the sub transfer arm mechanism 21B, 24B. Thus, these mechanisms become ready to use (Step S1). A recipe required for processing the wafers W of the same lot is previously stored in a memory of the controller. The controller 170 invokes the recipe and sends necessary instructions to the main transfer arm mechanism 122 and the sub transfer arm mechanisms 21B, 24B.

The first sub transfer arm mechanism 21B moves the arm holder 2 together with the transfer base table 4 in the X-axis direction on the base of the instruction from the controller 170 (Step S2) and simultaneously moves them in the Z-axis direction (Step S3). As a result, the arm holder 2 faces an opening portion of the cassette CR on the mounting table 20.

Subsequently, the arm holder is moved forward to insert the arm holder 2 in the cassette CR (Step S4). While the distance to the rear wall of the cassette CR is detected by a distance sensor (not shown), the controller 170 controls a moving amount of the arm holder 2. In this way, the arm holder 2 is positioned right under the wafer W while preventing the collision of the arm holder 2 upon the cassette CR. Thereafter, the arm holder 2 is moved up, the wafer W is transferred from the cassette CR to the arm holder 2 (Step S5).

Then, the movable pusher 8 is slidably moved forward by the air cylinder 9. The movable pusher 8 pushes the wafer W, so that the wafer W moves forward. The wafer W is pushed by the movable pusher 8 until the front end portion of the wafer W comes into contact with the stopper 2e (Step S6). In this manner, the wafer W is firmly held on the arm holder 2 and simultaneously positioned accurately.

Subsequently, the arm holder 2 is retreated to withdraw the arm holder 2 from the cassette CR (Step S7). The arm holder 2 is rotated together with the transfer base table 4 about the Z-axis by an angle of θ (Step S8) and simultaneously moved together with the transfer base table 4 in the X-axis direction (Step S9). In this way, the arm holder 2 faces the main transfer arm mechanism 122.

The first sub transfer arm mechanism 21B transfers the wafer W to the main transfer arm mechanism 122. The main transfer arm mechanism 122 moves up to the adhesion unit (AD) of the first process unit group G1 and then the wafer W is transferred into the adhesion unit (AD), in which the surface of the wafer W is treated so as to impart hydrophobic properties to the surface.

Then, the main transfer arm mechanism 122 transfers the wafer W to the prebaking unit (PREBAKE), the cooling unit (COL), the resist coating unit (COT), the prebake unit (PREBAKE), and the extension/cooling unit (EXTCOL) in the order mentioned.

Furthermore, the main transfer arm mechanism 122 transfers the wafer W to the second sub transfer arm mechanism 24B. The second sub transfer arm mechanism 24B transfers the wafer W to the peripheral light-exposure unit 23 in the interface section 112. When the peripheral light exposure process is completed, the second sub transfer arm mechanism 24B loads the wafer W into the light-exposure unit 200. At this time, the wafer W is sometimes temporality stored in the buffer cassette BR before loaded into the light exposure unit. Also the wafer immediately after unloaded from the light exposure apparatus is, in some cases, temporarily stored in the buffer cassette BR in the interface section 112.

The main transfer arm mechanism 122 transfers the post-exposure wafer W to the post baking unit (POBAKE), the cooling unit (COL), the development unit (DEV), the post baking unit (POBAKE) and the cooling unit (COL) in the order mentioned.

Furthermore, the main transfer arm mechanism 122 transfers the wafer W to the first sub transfer arm mechanism 21B. The first sub transfer arm mechanism 21B rotates the arm holder 2 about the Z-axis by an angle of θ (Step S8) and moves the arm holder 2 in the X-axis direction (Step S9). Furthermore, the arm holder 2 is moved up and down in the Z-axis direction (Step S10). In this manner, the arm holder 2 faces an opening portion of the cassette CR on the mounting table 20.

Subsequently, the arm holder 2 is moved forward to insert the arm holder 2 into the cassette CR (Step S11). The movable pusher 8 is then retreated, thereby releasing the wafer W from restraint of the movable pusher (Step S12). Subsequently, the arm holder 2 is moved down to transfer the wafer W to the cassette CR (Step S13). The arm holder 2 is retreated to withdraw the arm holder 2 from the cassette CR (Step S14). The arm holder 2 is rotated together with the transfer base table 4 about the Z-axis by an angle of θ (Step S15). In this manner, the wafer W is loaded into the cassette CR on the mounting table 20. When the cassette CR is filled with processed wafers W, the wafers W are unloaded from the system 100 while they are stored in the cassette CR.

According to the aforementioned embodiments, the wafer W does not move around on the arm holder 2. It is therefore possible to suppress generation of particles.

In the aforementioned embodiments, the wafer W is transferred to the light-exposure unit 200 while the wafer W is accurately aligned by the second sub transfer arm mechanism 24B. It is therefore possible to eliminate the wafer receiving table from the light-exposure unit and mount the wafer W on the alignment stage of the light-exposure unit 200 by the sub transfer arm mechanism 24B. Because of the absence of the wafer receiving table from the light-exposure unit 200 as described above, it is possible to simplify the light exposure unit 200 in structure, save space, and reduce the manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. In an apparatus for transferring a substrate comprising an arm holder moving into and out of a cassette while a substrate is mounted thereon, a forward and backward driving mechanism for moving the arm holder forward and backward, and a contact support member for supporting the substrate in contact with a lower surface peripheral portion of the substrate placed on the arm holder, the improvement of said contact support member comprising:
a first defining portion having a single stepped portion that supports a front peripheral portion of the substrate, and defines a front end of the substrate placed on the arm holder; and
a second defining portion that faces the first defining portion and having an upper stepped portion and a lower stepped portion that supports a rear peripheral portion of the substrate, and defines a rear end of the substrate placed on the arm holder, said upper stepped portion and said lower stepped portion being continuously formed smoothly via a rounded edge portion, the lower stepped portion substantially being arranged at the same height level as the single stepped portion of the first defining portion, the upper stepped portion being arranged at a different height level from the single stepped portion of the first defining portion, the lower stepped portion being positioned closer to the first defining portion than the upper stepped portion, a distance from the lower stepped portion to the single stepped portion of the first defining portion corresponding to a diameter of the substrate plus allowance,
wherein, when the forward and backward driving mechanism moves the arm holder backward, the rear peripheral portion of the substrate slides down due to an inertial force from the upper stepped portion to the lower stepped portion, thereby aligning the substrate with the arm holder.

2. An apparatus according to claim 1, wherein the lower stepped portion of the second defining portion is located nearer the stepped portion of the first defining portion than the upper stepped portion of the second defining portion.

3. An apparatus according to claim 1, wherein the upper stepped portion of the second defining portion is present in substantially the same plane as the stepped portion of the defining portion.

4. An apparatus according to claim 1, further comprising a transfer base table for movably supporting the arm holder and a contact member attached to the transfer base table, wherein when the arm holder is retreated by the forward and backward driving mechanism, the rear end of the substrate placed on the arm holder comes into contact with the contact member and thereby the rear end of the substrate is slid down from the upper stepped portion of the second defining portion to the lower stepped portion.

5. An apparatus according to claim 1, wherein the arm holder extends in the direction of moving forward and backward by the forward and backward driving mechanism, and at least one of the first and second defining portion is symmetrically arranged with respect to a longitudinal axis of the arm holder.

6. An apparatus according to claim 1, wherein at least one of the stepped portions of the first and second defining portions has a shape corresponding to an outer peripheral portion of the substrate.

7. An apparatus according to claim 1, wherein the substrate is a semiconductor wafer in a disk form and at least one of the stepped portions of the first and second defining portions has a shape corresponding to a peripheral shape of the semiconductor wafer.

8. In an apparatus for transferring a substrate comprising an arm holder moving into and out of a cassette while a substrate is mounted thereon, a forward and backward driving mechanism for moving the arm holder forward and backward, and a contact support member for supporting the substrate in contact with a lower surface peripheral portion of the substrate placed on the arm holder, the improvement of said contact support member comprising:

a first defining portion having a single stepped portion that supports a front peripheral portion of the substrate, and defines a front end of the substrate placed on the arm holder;

a second defining portion facing the first defining portion and having a stepped portion that supports a rear peripheral portion of the substrate, and defines a rear end of the substrate placed on the arm holder; and a push mechanism movably fitted near a rear end of the arm holder and slidable along an upper surface of the arm holder that moves the second defining portion toward the first defining portion, wherein said first defining portion has an inner surface that contacts the front peripheral portion of the substrate and said second defining portion has an inner surface that contacts the rear peripheral portion of the substrate, and wherein when the push mechanism moves the second defining portion, the substrate moves forward while the stepped portion of the second defining portion is in contact with the rear end of the substrate, thereby aligning the substrate with the arm holder.

9. An apparatus according to claim 8, further comprising a press member attached to the second defining portion, for pressing an upper portion of the rear end of the substrate and thereby suppressing the substrate from jumping, or being deflected upward from the arm holder.

10. In an apparatus for processing a substrate comprising a process section for processing a resist of a substrate, a cassette section for receiving the substrate together with a cassette and transferring the substrate to/from the process section, an interface section for transferring the substrate to/from another apparatus and transferring the substrate to/from the process section, and a substrate transfer apparatus arranged in at least one of the cassette section and the interface section, said substrate transfer apparatus comprising an arm holder moving into and out of a cassette while the substrate is mounted thereon, a forward and backward driving mechanism for moving the arm holder forward and backward, and a contact support member for supporting the substrate in contact with a lower surface peripheral portion of the substrate placed on the arm holder, the improvement of said contact support member comprising:

a first defining portion having a single stepped portion that supports a front peripheral portion of the substrate, and defines a front end of the substrate placed on the arm holder; and a second defining portion facing the first defining portion and having an upper stepped portion and a lower stepped portion that supports a rear peripheral portion of the substrate, for defines a rear end of the substrate placed on the arm holder, said upper stepped portion and said lower stepped portion being continuously formed smoothly via a rounded edge portion, the lower stepped portion substantially being arranged at the same height level as the single stepped portion of the first defining portion, the upper stepped portion being arranged at a different height level from the single stepped portion of the first defining portion, the lower stepped portion being positioned closer to the first defining portion than the upper stepped portion, a distance from the lower stepped portion to the single stepped portion of the first defining portion corresponding to a diameter of the substrate plus allowance, wherein, when the forward and backward driving mechanism moves backward the arm holder, the rear peripheral portion of the substrate slides down due to an inertial force from the upper stepped portion to the lower stepped portion, thereby aligning the substrate with the arm holder.

11. An apparatus according to claim 10, wherein the lower stepped portion of the second defining portion is located nearer the stepped portion of the first defining portion than the upper stepped portion of the second defining portion.

12. An apparatus according to claim 10, wherein the upper stepped portion of the second defining portion is present in substantially the same plane as the stepped portion of the first defining portion.

13. An apparatus according to claim 10, further comprising a transfer base table for movably supporting the arm holder and a contact member attached to the transfer base table, wherein when the arm holder is retreated by the forward and backward driving mechanism, the rear end of the substrate placed on the arm holder comes into contact with the contact member and thereby the rear end of the substrate is slid down from the upper stepped portion of the second defining portion to the lower stepped portion.

14. An apparatus according to claim 10, wherein the arm holder extends in the direction of moving forward and backward by the forward and backward driving mechanism, and at least one of the first and second defining portions is symmetrically arranged with respect to a longitudinal axis of the arm holder.

15. An apparatus according to claim 10, wherein at least one of the stepped portions of the first and second defining portions has a shape corresponding to an outer peripheral portion of the substrate.

16. An apparatus according to claim 10, wherein the substrate is a semiconductor wafer in a disk form and at least one of the stepped portions of the first and second defining portions has a shape corresponding to a peripheral shape of the semiconductor wafer.

17. In accordance for processing a substrate comprising a process section for processing a resist of a substrate, a cassette section for receiving the substrate together with a cassette and transferring the substrate to/from the process section, an interface section for transferring the substrate to/from another apparatus and transferring the substrate to/from the process section, and a substrate transfer apparatus arranged in at least one of the cassette section and the interface section, said substrate transfer apparatus comprising an arm holder moving into and out of a cassette while a substrate is mounted thereon, a forward and backward driving mechanism for moving the arm holder forward and backward, and a contact support member for supporting the substrate in contact with a lower surface peripheral portion of the substrate placed on the arm holder, the improvement of said contact support member comprising:

a first defining portion having a single stepped portion that supports a front peripheral portion of the substrate, and defines a front end of the substrate placed on the arm holder;

a second defining portion facing the first defining portion and having a stepped portion that supports a rear peripheral portion of the substrate, and defines a rear end of the substrate placed on the arm holder; and a push mechanism movably fitted near a rear end of the arm holder and slidable along an upper surface of the arm holder that moves the second defining portion toward the first defining portion, wherein said first defining portion has an inner surface that contacts the front peripheral portion of the substrate and said second defining portion has an inner surface that contacts the rear peripheral portion of the substrate, and wherein, when the push mechanism moves the second defining portion, the substrate moves forward while the stepped portion of the second defining portion is in contact with the rear end of the substrate, thereby aligning the substrate with the arm holder.

18. An apparatus according to claim 17, further comprising a press member attached to the second defining portion, for pressing an upper portion of the rear end of the substrate and thereby suppressing the substrate from jumping, or being deflected upward from the arm holder.

* * * * *